United States Patent
Elliott et al.

(10) Patent No.: US 7,092,890 B2
(45) Date of Patent: Aug. 15, 2006

(54) METHOD FOR MANUFACTURING THIN GAAS DIE WITH COPPER-BACK METAL STRUCTURES

(75) Inventors: Alexander J. Elliott, Tempe, AZ (US); Jeffrey D. Crowder, Phoenix, AZ (US); Monte G. Miller, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/050,079

(22) Filed: Feb. 3, 2005

(65) Prior Publication Data
US 2005/0127480 A1 Jun. 16, 2005

Related U.S. Application Data

(62) Division of application No. 10/306,834, filed on Nov. 27, 2002, now Pat. No. 6,870,243.

(51) Int. Cl.
*G21K 1/12* (2006.01)
(52) U.S. Cl. .................. 705/1; 257/666; 257/473; 257/669; 257/675; 257/700
(58) Field of Classification Search ............ 705/1, 705/14; 257/666, 473, 669, 675, 700
See application file for complete search history.

(56) References Cited

U.S. PATENT DOCUMENTS

| | | | | |
|---|---|---|---|---|
| 3,755,720 A | * | 8/1973 | Kern | 257/794 |
| 3,942,186 A | * | 3/1976 | McAvoy et al. | 257/275 |
| 4,321,099 A | * | 3/1982 | Frosch et al. | 438/89 |
| 4,543,442 A | * | 9/1985 | Alcorn et al. | 136/255 |
| 4,872,047 A | * | 10/1989 | Fister et al. | 257/747 |
| 4,989,117 A | * | 1/1991 | Hernandez | 361/306.2 |
| 5,528,076 A | * | 6/1996 | Pavio | 257/666 |
| 5,545,289 A | * | 8/1996 | Chen et al. | 438/694 |
| 5,622,305 A | * | 4/1997 | Bacon et al. | 228/123.1 |
| 5,821,154 A | * | 10/1998 | Nashimoto et al. | 438/457 |
| 6,010,966 A | * | 1/2000 | Ionov | 438/706 |
| 6,105,865 A | * | 8/2000 | Hardesty | 235/380 |

(Continued)

FOREIGN PATENT DOCUMENTS

| | | |
|---|---|---|
| EP | 0194475 A2 | 9/1986 |
| EP | 1063701 A2 | 12/2000 |

(Continued)

OTHER PUBLICATIONS

Grebs et al., "The Use of Copper Based Backmetal Schemes as a Low Stress and Low Thermal Resistance Alternative for Use in Thin Substrate Power Devices," Electrochemical Society Proceedings vol. 99-9, XP008011990, Harris Corporation, Mountaintop, PA, pp. 185-193, Mar. 5, 1999.

(Continued)

*Primary Examiner*—Elisca Pierre Eddy

(57) ABSTRACT

A thin GaAs Substrate can be provided with a copper back-metal layer to allow the GaAs Substrate to be packaged using conventional plastic packaging technologies. By providing the GaAs Substrate with a copper back-metal layer, the GaAs Substrate can be made thinner than 2 mils (about 50 microns), thereby reducing heat dissipation problems and allowing the semiconductor die to be compatible with soft-solder technologies. By enabling the semiconductor die to be packaged in a plastic package substantial cost savings can be achieved.

20 Claims, 2 Drawing Sheets

U.S. PATENT DOCUMENTS

| | | | |
|---|---|---|---|
| 6,426,289 B1 * | 7/2002 | Farrar | 438/670 |
| 6,583,500 B1 * | 6/2003 | Abbott et al. | 257/666 |
| 6,609,106 B1 * | 8/2003 | Robertson | 705/26 |
| 6,870,243 B1 * | 3/2005 | Elliott et al. | 257/666 |
| 2004/0146138 A1 * | 7/2004 | Jiao | 378/19 |

FOREIGN PATENT DOCUMENTS

| | | | |
|---|---|---|---|
| JP | 361174723 A | * | 8/1986 |

OTHER PUBLICATIONS

Chen et al., "Backside Copper Metallisation of GaAs MESFETs," Electronic Letters, vol. 36, No. 15, Jul. 20, 2000.

Chen et al., "Backside Copper Metallization of GaAs MESFETs Using TaN as the Diffusion Barrier," 2001 IEEE, IEEE Transactions on Electron Device, vol. 48, No. 6, XP-001082386, Jun. 2001.

* cited by examiner

METHOD FOR MANUFACTURING THIN GAAS DIE WITH COPPER-BACK METAL STRUCTURES

CROSS-REFERENCE TO RELATED APPLICATIONS

The present application is a divisional of U.S. patent application Ser. No. 10/306,834, filed on Nov. 27, 2002 and entitled "THIN GAAS DIE WITH COPPER BACK METAL STRUCTURE," the entirety of which is incorporated by reference herein.

FIELD OF THE DISCLOSURE

This invention relates generally to semi-conductor devices, and more particularly to Gallium Arsenide (GaAs) semiconductor devices.

BACKGROUND

Two of the most common types of semiconductor die packages currently used are plastic packages and ceramic packages. Ceramic packages are preferred over plastic packages in some instances (e.g. when hemeticity and/or high frequency is required), but plastic packages are generally preferred over ceramic packages because plastic packages are less expensive.

Plastic packages are routinely used to package silicon die, however, attempts to package GaAs semiconductor die in plastic packages have proven somewhat problematic. For example, although relatively thick GaAs die (i.e. those die having a thickness greater than about 3 mils) can be packaged in plastic, power dissipation characteristics of thick GaAs die limit the maximum power capabilities that can be implemented.

In order to overcome the power dissipation problems and allow more complex circuits, attempts have been made to reduce the thickness of the GaAs die to less than 3 mils. However, the die handling processes associated with packaging are incompatible with thin, i.e. less than 3 mils, GaAs die. The use of a thick, about 18 μm, gold back metal layer has been proposed in an attempt to strengthen GaAs die thinned for power dissipation purposes. Unfortunately, the thick gold back-metal layer is incompatible with plastic packaging processes for at least two reasons: 1) the thick gold causes embrittlement of the soft-solder used in plastic packaging processes to attach the semiconductor die to the lead-frame; and 2) gold tends to de-laminate from a plastic package.

What is needed, therefore, is a way to allow high-powered GaAs semiconductor die to be used in plastic packages. By allowing a high-powered semiconductor die to be used in a plastic package, substantial cost savings could be achieved without performance loss.

BRIEF DESCRIPTION OF THE DRAWINGS

Various advantages, features and characteristics of the present disclosure, as well as methods, operation and functions of related elements of structure, and the combination of parts and economies of manufacture, will become apparent upon consideration of the following description and claims with reference to the accompanying drawings, all of which form a part of this specification.

DETAILED DESCRIPTION OF THE FIGS.

Figure 1:
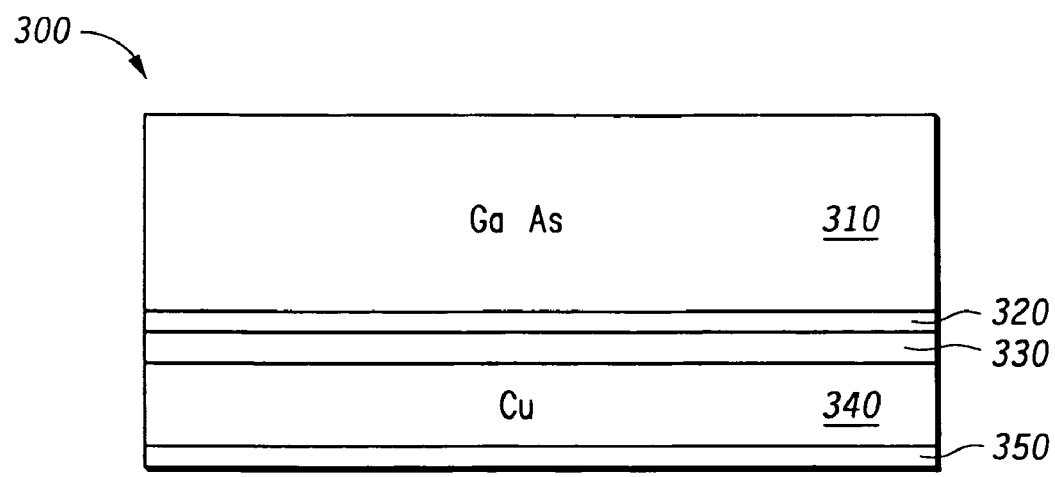
FIG. 1 is a diagram of a thin GaAs semiconductor die having a copper back-metal structure according to an embodiment of the present disclosure.
Figure 2:
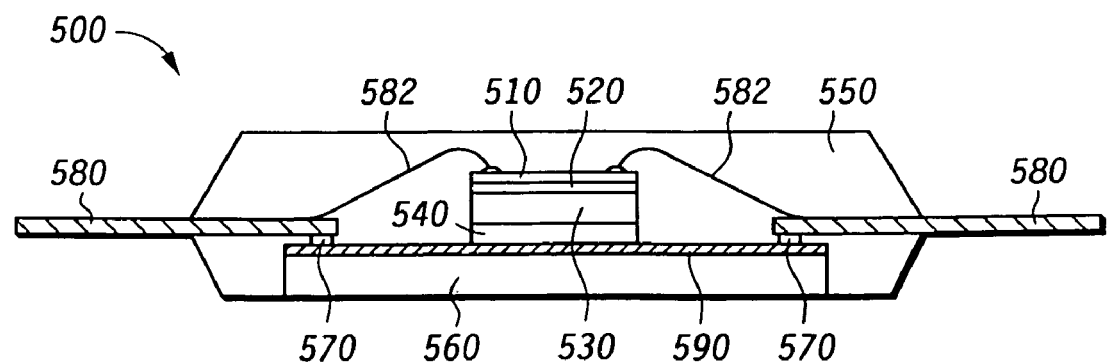
FIG. 2 is a diagram of a thin GaAs die having a copper back-metal structure encapsulated in a plastic package according to an embodiment of the present disclosure.
Figure 3:
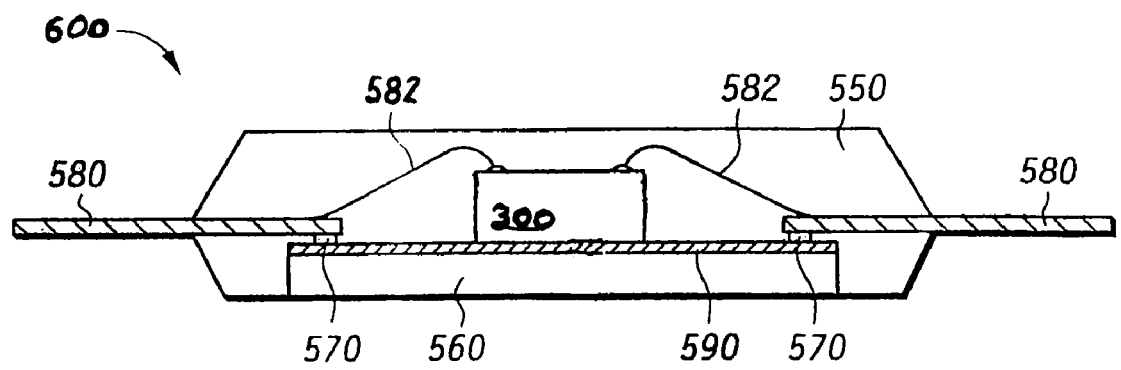
FIG. 3 is a diagram of the thin GaAs die of FIG. 1 encapsulated in a plastic package according to an embodiment of the present disclosure.

FIGS. 1–3 illustrate a thin GaAs die with a copper back-metal structure suitable for use in a plastic package, in accordance with the present disclosure. In certain embodiments, various anti-stress and oxidation resistant layers are shown in addition to the copper back-metal layer. FIG. 2 illustrates a completed semiconductor die encapsulated in a plastic package. FIG. 3 illustrates the die of FIG. 1 in the plastic package of FIG. 2. FIG. 3 illustrates the die of FIG. 1 in the plastic package of FIG. 2. By providing a copper back-metal structure, a thin, high power, GaAs semiconductor die can be used in a plastic package. In general, the GaAs substrate is less than 2 mils (about 50 microns) thick, and particular embodiments of the GaAs substrate of the semiconductor die have thicknesses of approximately 1–2 mils (about 25–50 microns), less than approximately 1.5 mils (about 38 microns), or less than or equal to approximately 1 mil (about 25 microns). Approximately (and about), as used herein, generally refers to process limitations. For example, if a particular process for polishing a semiconductor substrate is conventionally performed to within 10 percent of the desired process parameter, then a substrate having a nominal thickness of approximately 1 mil (about 25 microns) will have an actual thickness of 0.9 mils (about 22 microns) to 1.1 mils (about 28 microns).

The copper back-metal layer provides both mechanical strength and improved heat dissipation properties to the GaAs die, and makes the GaAs die compatible with soft-solder die attach technologies. Soft solder die attach refers to die attach methods using soft solders that generally comprise about 5% tin and 95% lead. Since soft-solder die attached methods are used when preparing a semiconductor die for encapsulation in a plastic package, the thin GaAs substrate with copper back-metal layer can be packaged in a plastic package.

In discussing the structure of the semiconductor die illustrated in FIGS. 1–2, it will be appreciated that various processes known to those skilled in the art may be used in constructing the thin GaAs semiconductor die, the copper back-metal layer and other layers used for mechanical stress reduction, oxidation resistance, etc. The various layers described may be deposited using conventional sputtering, coating, crystalline growth, implantation, and/or other appropriate methods known to those skilled in the art.

Referring now to FIG. 1, a thin GaAs semiconductor die with a copper back-metal layer will be discussed, wherein the semiconductor die is designated generally as Die 300. Die 300 includes a GaAs Substrate 310 in which a semiconductor circuit is formed using methods known to those skilled in the art. While not shown in FIG. 1, GaAs Substrate 310 may also include various interconnection terminals on top of GaAs Substrate 310 for connecting Die 300 to leads during the packaging process. A Diffusion Barrier 320 is formed over the bottom of GaAs Substrate 310, such that any subsequent layers formed over Diffusion Barrier 320 will not adversely impact the semiconductor circuits within GaAs Substrate 310. In at least one embodiment, Diffusion Barrier 320 includes an adhesion metal such as tantalum deposited in the form of tantalum nitride, or another suitable diffusion barrier known to those skilled in the art.

It will be appreciated that the term "over" or "overlying" is used to describe a layer formed completely or partially over another layer or surface. For purposes of discussion herein the term "overlying" is used irrespective of the surface of the substrate on which overlying layer is formed. For example, a layer formed on the backside surface of a substrate and a layer formed on an active surface of a substrate are both considered to be overlying the substrate.

A Stress Relief Layer 330 is formed over Diffusion Barrier 320 in at least one embodiment. Stress Relief Layer 330 provides protection for GaAs Substrate 310 and or diffusion layer 320 from uneven expansion, contraction or other physical movements of a back-metal or other layer overlying Stress Relief Layer 330. In at least one embodiment gold is used as a stress relief layer. While FIG. 1 illustrates a single stress relief layer, using more than one stress relief layer does not depart from the spirit and scope of the present invention.

On top of Stress Relief Layer 330, a Copper Back-metal Layer 340 is formed. Copper Back-metal Layer 340 has a thickness chosen to be sufficient to provide the necessary support for GaAs Substrate 310 during the packaging process, including the process of soft-solder die attach. For example, a 3-mil-thick (about 76 microns) GaAs die needs very little, if any, additional mechanical support. Consequently, a 3-mil-thick (about 76 microns) GaAs die may not include Copper Back-metal Layer 340. However, a 1 mil thick (about 25 microns) GaAs die may include a Copper Back-metal layer 340 having a thickness of between about 11–15 microns to provide the additional mechanical support.

An appropriate thickness for Copper Back-metal Layer 340 can be selected empirically. For example, if it is known that 18–19 microns of gold are needed to provide adequate mechanical strength for a 25 micron thick GaAs die, then using the known physical properties of gold and copper, for example tensile strength, malleability, etc., the thickness of copper needed to provide an equivalent mechanical stability can be calculated.

In addition to mechanical support, Copper Metal Back layer 340 provides improved heat dissipation as compared to a thick GaAs substrate. As a result, GaAs Substrate 310 can be made thinner and still dissipate enough heat through the use of the Copper Metal Back layer 340 to support high power circuits formed overlying the thin GaAs Substrate 310. Those skilled in the art can readily calculate the amount of heat dissipation required by the circuits, and incorporate that information in their decision regarding the thickness of Copper Back-metal Layer 340.

Finally, an Oxidation Resistant Layer 350 is formed over Copper Back-metal Layer 340 to prevent oxidation of Copper Back-metal Layer 340. Oxidation of Copper Back-metal Layer 340 is undesirable, since oxidation can adversely affect both the electrical and heat transfer properties of Copper Back-metal Layer 340. In addition, the oxidation can adversely affect the bonding of Copper Back-metal layer 340 to the packaging (e.g. to the solder). In at least one embodiment, Oxidation Resistant Layer 350 is a thin layer of gold about 1500 Angstroms thick, which is referred to as a flash of gold. It will be appreciated that the thickness of Oxidation Resistant Layer 350 should be limited, particularly when gold is used, because solder embrittlement may occur due to soft-solder attachment of Die 300 to a lead frame if the Oxidation Resistant Layer 350 is formed too thick.

The semiconductor die shown in FIG. 1 is compatible with soft-solder die attach processes that are commonly used during packaging operations. In at least one embodiment, the GaAs Substrate 310 is less than 2 mils thick, thereby allowing a relatively high power circuit to be formed in GaAs Substrate 310. In other embodiments, GaAs Substrate 310 is less than 1 mil thick, and in at least one embodiment, GaAs Substrate 410 is nominally 1 mil (about 25 microns). The use of Copper Back-metal Layer 340 also permits Die 300 to be packaged in a plastic package, because Semiconductor Die 300 is compatible with soft-solder die attach methods.

Referring next to FIG. 2 a semiconductor die having a thin GaAs substrate and a copper back-metal layer are illustrated inside of a plastic package according to an embodiment of the present invention. The packaged die will be referred to as Plastic Die Package 500. The semiconductor die illustrated in FIG. 2 includes a thin GaAs Substrate 510 (in one embodiment having a thickness in the range of 15–35 microns), a Diffusion Barrier 520, a Copper Back-metal Layer 530 and an Oxidation Resistant Layer 540. The semiconductor die is attached to Flag 560 using a soft-solder die attach method. Flag 560 is coated with Soft-solder Layer 590. Soft-solder Layer 590 is a layer of soft-solder, which in at least one embodiment comprises 5% tin and 95% lead. In alternate embodiments, eutectic solder or conductive epoxies can be used.

In order to attach the semiconductor die to Flag 560, Soft-solder Layer 590 is heated, and brought into contact with the oxidation resistant layer 540 of the semiconductor die. The Oxidation Resistant Layer 540, a portion of the Copper Back-metal Layer 530 and Soft-solder Layer 590 melt such that the components of each of the layers intermingle with the others to form a solder joint when the heat is removed and the materials are allowed to cool. In at least one embodiment, when the solder process is complete, Soft-solder Layer 590 is adjacent to Copper Back-metal Layer 530, and the material in Oxidation Resistant Layer 540 (e.g. gold) is present within Soft-solder Layer 590, and at the interface between Soft-solder Layer 590 and Copper Back-metal Layer 530. Once the semiconductor die is attached to Flag 560, Flag 560 can provide an excellent thermal sink for the semiconductor die.

After the semiconductor die is attached to Flag 560, Bonding Wires 582 are bonded to the die and Bonding Fingers 580, and then the assembly is in a mold die. Usually a plurality of such assemblies, e.g. as exist in a lead frame, is placed in a mold die. A thermoset plastic compound is transferred into a cavity of the mold die to encapsulate the semiconductor die, thus forming a completed semiconductor package such as Plastic Die Package 500. The thermoset plastic may be cured, and further processing (e.g. lead trim and form, package marking, and test) occur in a conventional manner.

In summary, then, a thin GaAs Substrate can be provided with a copper back-metal layer to allow the GaAs Substrate to be packaged using conventional plastic packaging technologies. By providing the GaAs Substrate with a copper metal back layer, the GaAs substrate can be made thinner than 2 mils (about 50 microns), thereby reducing heat dissipation problems as well as allowing the semiconductor die to be compatible with soft-solder techniques. By enabling the semiconductor die to be packaged in a plastic package substantial cost savings can be achieved.

In the preceding detailed description of the figures, reference has been made to the accompanying drawings, which form a part thereof, and in which is shown by way of illustration specific embodiments in which the invention may be practiced. These embodiments are described in sufficient detail to enable those skilled in the art to practice the disclosure, and it is to be understood that other embodiments may be utilized and that logical, mechanical, chemical, and electrical changes may be made without departing from the spirit or scope of the disclosure. Furthermore, many other varied embodiments that incorporate the teachings of the disclosure may be easily constructed by those skilled in the art. For example, additional diffusion layers and/or stress relief layers can be used in addition to those described. Accordingly, the present disclosure is not intended to be limited to the specific form set forth herein, but on the contrary, it is intended to cover such alternatives, modifications, and equivalents, as can be reasonably included within the spirit and scope of the invention. The preceding detailed description is, therefore, not to be taken in a limiting sense, and the scope of the present disclosure is defined only by the appended claims.

What is claimed is:

1. A method comprising:
   placing a GaAs die having a thickness of less than approximately 50 microns on a lead frame having a die attach surface comprising a soft solder; and
   heating the soft solder to attach the die to the lead frame.

2. The method as in claim 1, further including encapsulating the GaAs die in a plastic die package.

3. The method as in claim 1, wherein the GaAs die comprises:
   said GaAs substrate having an active surface and a backside surface;
   a diffusion barrier layer overlying the backside surface; and
   a copper back-metal layer overlying the diffusion barrier.

4. The method as in claim 3, wherein the GaAs substrate has a thickness of between approximately 15 microns and 50 microns.

5. The method as in claim 3, wherein the GaAs substrate has a thickness in the range of approximately 15–35 microns.

6. The method as in claim 3, wherein the GaAs substrate has a thickness of less than approximately 25 microns.

7. The method as in claim 3, wherein the copper back-metal layer has a thickness sufficient to provide mechanical support for the GaAs substrate during a soft-solder die attach process.

8. The method as in claim 3, wherein after the soft solder is heated, gold is intermingled with the soft solder.

9. A method comprising:
   forming a diffusion barrier layer overlying a backside surface of a GaAs substrate;
   forming a stress relief layer overlying the diffusion barrier layer;
   forming a copper back-metal layer overlying the stress relief layer; and
   forming an oxidation resistant layer overlying the copper-back metal layer.

10. The method as in claim 9, wherein the stress relief layer and the oxidation resistant layer comprise gold layers.

11. The method as in claim 9, further comprising coupling the oxidation resistant layer to a die attach surface of a lead frame.

12. The method as in claim 11, further comprising encapsulating the GaAs substrate, the stress relief layer, the copper back-metal layer and the oxidation resistant layer in a plastic die package.

13. The method as in claim 9, wherein coupling the oxidation resistant layer to a die attach surface comprises reflowing a soft solder layer overlying the die attach surface so as to form a solder joint between the die attach surface and at least the oxidation resistant layer.

14. The method as in claim 9, wherein the GaAs substrate has a thickness of between approximately 15 microns and 50 microns and the back-metal layer has thickness of between approximately 11 microns to 15 microns.

15. A method comprising:
   forming a semiconductor die comprising a GaAs substrate and a copper back-metal layer overlying a backside surface of the GaAs substrate;
   disposing the semiconductor die at a soft solder layer of a die attach surface of a lead frame;
   reflowing the soft-solder layer so as to form a solder joint between the die attach surface and the semiconductor die;
   electrically coupling the semiconductor die to one or more leads of the lead frame; and
   encapsulating the semiconductor die and the lead frame in a plastic die package.

16. The method as in claim 15, wherein forming the semiconductor die comprises forming a stress-relief layer overlying the backside surface of the GaAs substrate, wherein the stress relief layer is between the backside surface of the GaAs substrate and the back-metal layer.

17. The method as in claim 15, wherein forming the semiconductor die comprises forming an oxidization resistant layer overlying the back-metal layer.

18. The method as in claim 15, wherein forming the semiconductor die comprises forming a stress-relief layer overlying the backside surface of the GaAs substrate, wherein the stress-relief layer is between the backside surface and the back-metal layer.

19. The method as in claim 15, wherein reflowing the soft solder layer comprises providing sufficient heat to at least partially melt the copper back-metal layer.

20. The method as in claim 15, wherein the GaAs substrate has a thickness of between approximately 15 microns and 50 microns and the back-metal layer has thickness of between approximately 11 microns to 15 microns.

* * * * *